Figure 1:
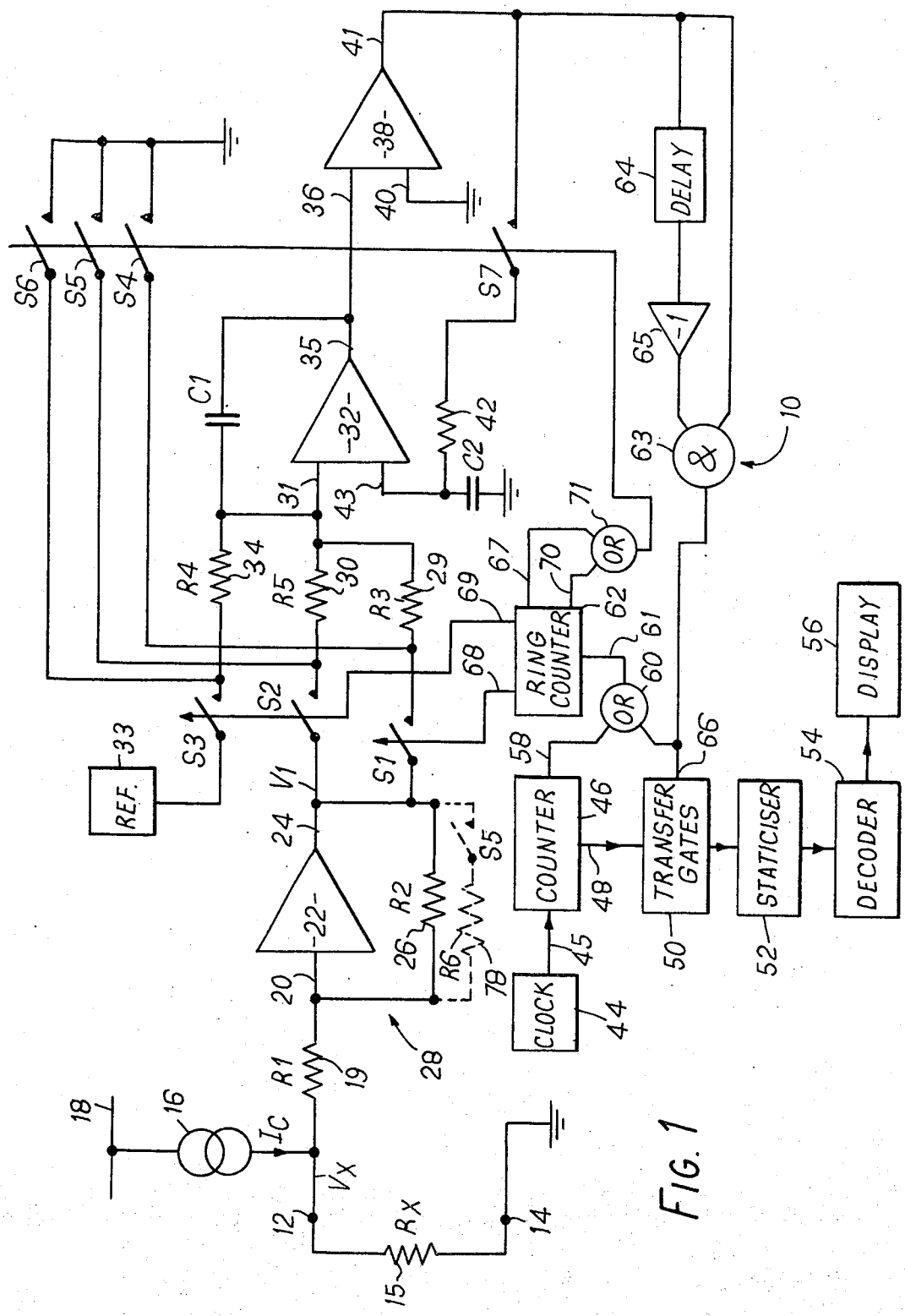

United States Patent [19]

Ryder

[11] 3,978,402
[45] Aug. 31, 1976

[54] APPARATUS FOR PRODUCING AN ELECTRICAL OUTPUT SIGNAL WHOSE MAGNITUDE IS LINEARLY REPRESENTATIVE OF THE VALUE OF AN UNKNOWN RESISTANCE

[75] Inventor: Alan Ryder, Church Crookham, England

[73] Assignee: The Solartron Electronic Group Limited, Farnborough, England

[22] Filed: Feb. 26, 1975

[21] Appl. No.: 553,378

[30] Foreign Application Priority Data
Mar. 6, 1974  United Kingdom............... 10002/74

[52] U.S. Cl................................ 324/62; 324/99 D; 340/347 NT
[51] Int. Cl.²........................................ G01R 27/02
[58] Field of Search........................... 324/62, 99 D; 340/347 NT

[56] References Cited
UNITED STATES PATENTS

| 3,500,384 | 3/1970 | Naydan et al. | 340/347 NT |
| 3,566,265 | 2/1971 | Reid | 340/347 NT |
| 3,660,834 | 5/1972 | Picot | 340/347 NT |
| 3,711,850 | 1/1973 | Kelly | 340/347 NT |
| 3,849,775 | 11/1974 | Buchanan et al. | 340/347 NT |
| 3,875,503 | 4/1975 | Hayashi | 324/62 |
| 3,895,376 | 7/1975 | Uchida | 324/62 R X |
| 3,896,431 | 7/1975 | Dickinson | 340/347 NT |

Primary Examiner—Gerard R. Strecker
Attorney, Agent, or Firm—William R. Sherman; Kevin McMahon

[57] ABSTRACT

In a DVOM of the dual slope type, an unknown resistance or conductance to be measured is connected to a reference signal source to generate a voltage or current which is measured by the DVOM. However, if the input impedance of the DVOM is not extremely high, it loads the unknown resistance or conductance, and renders the relationship between the value of the unknown resistance or conductance and the actual voltage or current measured by the DVOM non-linear. In order to correct for this, a proportion of this actual voltage or current is algebraically summed with the reference signal used in the DVOM for generating the second slope of its dual slope operation, the proportion being selected in dependence on the input impedance of the DVOM (which can thus now take any convenient value) to linearize the relationship between the value of the unknown resistance or conductance and the output signal of the DVOM.

36 Claims, 4 Drawing Figures

APPARATUS FOR PRODUCING AN ELECTRICAL OUTPUT SIGNAL WHOSE MAGNITUDE IS LINEARLY REPRESENTATIVE OF THE VALUE OF AN UNKNOWN RESISTANCE

This invention relates to apparatus for producing an electrical output signal whose magnitude is linearly representative of the value of an unknown electrical resistance or conductance, and is more particularly but not exclusively concerned with digital ohmmeters incorporating such apparatus.

In a typical digital ohmmeter arranged to measure the value of an unknown resistance, a known constant current is passed through the unknown resistance to generate thereacross a voltage whose magnitude is linearly related to the value of the resistance, and this voltage is then applied to and measured by an analogue-to-digital converter, e.g. of the dual slope type. If the input impedance of the analogue-to-digital converter is very large compared to the highest value of resistance to be measured, the magnitude of the voltage is not affected by its application to the converter and it is a simple matter to arrange that the digital output signal produced by the converter is linearly representative of the value of the resistance. However, when the highest value of resistance to be measured is relatively large, it becomes both difficult and expensive to provide the analogue-to-digital converter with a sufficiently high input impedance to ensure that the linear relationship between the value of the resistance and the voltage actually converted by the converter is maintained. It is one object of the present invention to overcome this difficulty.

According to one aspect of the present invention, therefore, there is provided apparatus for producing an electrical output signal whose magnitude is linearly representative of the value of an unknown electrical resistance, the apparatus comprising:

means for passing a current through the unknown resistance to generate an analogue voltage thereacross whose magnitude is dependent on the magnitude of the resistance;

integrating means;

first circuit means for applying the analogue voltage to the integrating means during a first time interval so as to drive the level of the signal at the output of the integrating means away from a datum value;

a source of a reference signal;

second circuit means for applying the algebraic sum of the reference signal and a predetermined multiple of the analogue voltage to the integrating means during a second time interval so as to drive the level of the signal at the output of the integrating means back towards the datum value; and means for producing an output signal whose magnitude is representative of the ratio between the respective durations of said first and second time intervals;

the magnitude of said predetermined multiple of the analogue voltage being selected to ensure that said ratio is linearly related to the value of the unknown resistance, whereby the magnitude of said output signal is linearly representative of the value of the unknown resistance.

The current passing means may comprise a constant current source arranged, in operation, to pass a substantially constant current through the unknown resistance. Alternatively, the current passing means may comprise a reference voltage source, which may also constitute said reference signal source, and a known resistance, the arrangement being such that, in operation, the reference voltage source is connected to the series combination of the known and unknown resistances.

In a typical digital ohmmeter arranged to measure the value of an unknown conductance, a known voltage is applied to the conductance to pass therethrough a current whose magnitude is dependent upon the value of the conductance. This current is again applied to and measured by an analogue-to-digital converter, e.g. of the dual slope type. In order to protect the analogue-to-digital converter and/or the source of the known voltage, it is desirable to connect a current-limiting resistance in series with the unknown resistance. The presence of this current-limiting resistance renders the relationship between the value of the unknown conductance and the current passing through the series combination of the unknown conductance and the current-limiting resistance nonlinear. It is a further object of the present invention to overcome this difficulty.

According to another aspect of the present invention, therefore, there is provided apparatus for producing an electrical output signal whose magnitude is linearly representative of an unknown electrical conductance, the apparatus comprising:

means for applying a voltage to the unknown conductance to pass therethrough an analogue current whose magnitude is dependent on the magnitude of the conductance;

integrating means;

first circuit means for applying the analogue current to the integrating means during a first time interval so as to drive the level of the signal at the output of the integrating means away from a datum value, a source of a reference signal;

second circuit means for applying the algebraic sum of the reference signal and a predetermined multiple of the analogue current to the integrating means during a second time interval so as to drive the level of the signal at the output of the integrating means back towards the datum value; and means for producing an output signal whose magnitude is representative of the ratio between the respective durations of said first and second time intervals;

the magnitude of said predetermined multiple of the analogue current being selected to ensure that said ratio is linearly related to the value of the unknown conductance, whereby the magnitude of said output signal is linearly representative of the value of the unknown conductance.

In either aspect of the invention, the first time interval may include the second time interval, or may precede the second time interval.

Conveniently, the first time interval is of substantially fixed duration, whereby the duration of the second time interval is linearly related to the value of the unknown resistance or conductance. In this case, the output signal producing means may simply comprise means for producing an output pulse whose duration is equal or linearly related to the duration of the second time interval. Alternatively, the output signal producing means may comprise a source of clock pulses and counter means arranged to count the clock pulses throughout the second time interval, the ouput signal being constituted by or derived from the count in the counter means at the end of the second time interval.

The integrating means may conveniently comprise a capacitance, which is preferably feedback connected between the output and the input of an inverting amplifier. In this case, the first circuit means may comprise an input resistance connected in series with the input of the inverting amplifier, and may further comprise a buffer amplifier connected in series with said input resistance, the buffer amplifier having a second input resistance and a feedback resistance, the output of the buffer amplifier being connected to the firstmentioned input resistance.

The second circuit means may comprise a third input resistance connected between the reference signal source and the input of the inverting amplifier and fourth input resistance connected to receive said analogue voltage or current either directly or, if the buffer amplifier is present, via the buffer amplifier.

Figure 2:
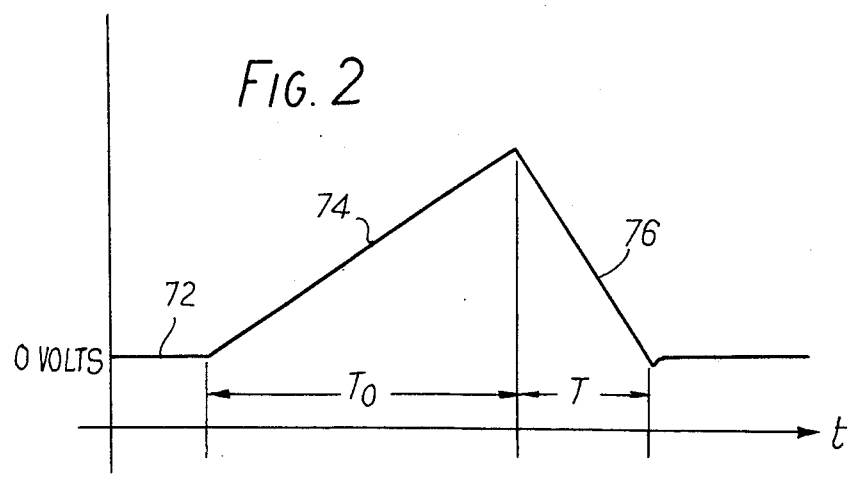
Figure 3:
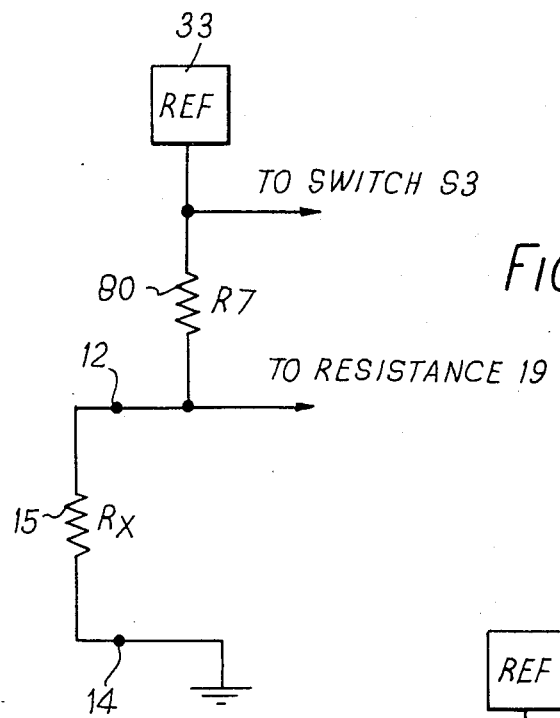
Figure 4:
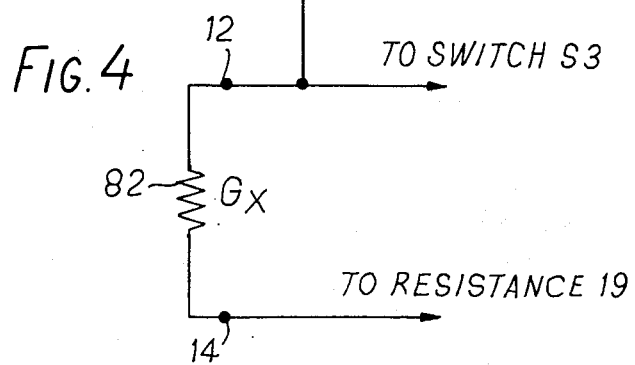

The invention will now be described, by way of example only, with reference to the accompanying drawings, of which:

FIG. 1 is a simplified block circuit diagram of a digital ohmmeter in accordance with the present invention;

FIG. 2 is an explanatory diagram showing the voltage waveform produced at a point in the circuit of the ohmmeter of FIG. 1 during operation; and FIGS. 3 and 4 show alternative embodiments of part of the circuitry of the ohmmeter of FIG. 1. The digital ohmmeter of FIG. 1 is indicated generally at 10, and comprises a pair of input terminals 12, 14 between which an unknown resistance 15 whose value $R_x$ is to be measured is connected. The terminal 12 is connected to the output of a constant current source 16, which is connected between the terminal 12 and a positive power supply rail 18, while the terminal 14 is grounded. The terminal 12 is also connected, via a resistance 19, to the input 20 of a high gain inverting amplifier 22, whose output 24 is connected back to its input 20 via feedback resistance 26. The amplifier 22 and the resistances 19 and 26 together constitute a buffer amplifier, which is indicated generally by the reference numeral 28.

The output 24 of the amplifier 22 is connected, via a switch S1 in series with a resistance 29, and via a switch S2 in series with a resistance 30, to the inverting input 31 of a high gain differential amplifier 32. A source 33 of a positive reference voltage $V_R$ is also connected to the input 31 of the amplifier 32, this time via a switch S3 in series with a resistance 34. The respective ends of the resistances 29, 30 and 34 remote from the input 31 of the amplifier 32 are connected via respective switches S4 to S6 to ground. The output 35 of the amplifier 32 is connected back to the input 31 via a feedback capacitance C1, so that the amplifier 32 and the capacitance C1 together constitute an integrator for linearly integrating current supplied to the input 31.

The output 35 of the amplifier 32 is also connected to the inverting input 36 of a further differential amplifier 38, whose other input 40 is grounded. The amplifier 38 constitutes a voltage comparator, and its output 41 is connected, via a switch S7 in series with a resistance 42, to the noninverting input 43 of the amplifier 32. A capacitance C2 is connected between the input 43 of the amplifier 32 and ground.

A clock pulse generator 44, which is typically crystal-controlled and has a typical operating frequency of 10kHz, is connected to supply clock pulses to the count input 45 of a three decade BCD counter 46. The counter 46 has a plurality of count outputs 48 connected via a set of transfer gates 50 to a staticiser (or store) 52, which is connected in turn via a decoder 54 to a display unit 56. The counter 46 also has an overflow (or full house output 58, which is connected to one input of a two-input OR gate 60 whose output is connected to the input 61 of a four stage ring counter 62.

The other input of the OR gate 60 is connected to the output of a two input AND gate 63, one or whose inputs is directly connected to be energised from the output 41 of the amplifier 38, and the other of whose inputs is connected to be energised from the output 41 via a delay 64 and an inverter 65. The output of the AND gate 63 is also connected to an enabling input 66 of the transfer gates 50.

The ring counter 62 has four count outputs 67, 68, 69, 70 which are sequentially energised in response to successive signals at its input 61. The outputs 67 and 70 are connected via an OR gate 71 to operate the switches S4 to S7, the output 68 is connected to operate the switch S1, and the output 69 is connected to operate the switches S2 and S3.

In operation, the constant current source 16 draws a constant current $I_c$ through the unknown resistance 15, generating a voltage $V_x$ thereacross which is dependent on the value $R_x$ of the unknown resistance. If the value R1 of the input resistance 19 of the buffer amplifier 28 were very high compared to $R_x$, then the voltage $V_x$ would be linearly related to $R_x$ in accordance with the equation $V_x = I_c R_x$. However, as mentioned earlier, if the highest value of $R_x$ to be measured is relatively large, it is both difficult and expensive to ensure that R1 is sufficiently high for this equation to hold for all possible values of $R_x$. In the ohmmeter 10 of FIG. 1, the value R1 of resistance 19 is arranged to be comparable with $R_x$, so that the voltage $V_x$ is actually given by $$V_x = \frac{I_c R_x R1}{R1 + R_x} \qquad (1)$$

It is the voltage defined by equation (1) which is measured by the analogue-to-digital converter which forms the remainder of the ohmmeter.

Assuming that the count in the ring counter 62 is initially one, then the output 67 thereof is energised while the other three outputs 68, 69, 70 are de-energised. The signal at the output 67 is operative via the OR gate 71 to close the switches S4 to S7 while the switches S1, S2 and S3 are arranged to be open. Closure of the switches S4 to S7 is effective, in known manner, to store on the capacitance C2 an error voltage which compensates for the offset or drift voltages normally inherent in the amplifiers 32 and 38. At this point, the voltage at the output 35 of the amplifier 32 is substantially zero, as shown at 72 in FIG. 2.

The count in the counter 46 increases in response to the clock pulses from the clock pulse generator 44 until it reaches its full house value of 999, whereupon an overflow signal is produced at the output 58 as the count changes from 999 to 000 and the counter 46 recommences counting upwardly. This overflow signal is operative via the OR gate 60 to advance the count in ring counter 62 to two, which opens the switches S4 to S7 and closes the switch S1. Closure of the switch S1 initiates a first time interval, during which a current $I_1$ defined by the voltage $V_1$ at the output 24 of the buffer amplifier 28 and the value R3 of the resistance 28 is applied to the input 31 of the amplifier 32 and linearly integrated thereby in conjunction with the capacitance C1. The voltage at the output 35 of the amplifier 32 therefore ramps linearly away from zero in the positive direction, as shown at 74 in FIG. 2. This positive-going ramp continues until the counter 46 again produces an overflow signal at its output 58, which overflow signal advances the count in the ring counter 62 to three and thereby opens the switch S1 to terminate the first time interval and the positive-going ramp. The first time interval thus has a fixed duration $T_o$ of 100 milliseconds.

Since the gain of the buffer amplifier 22 is -R2/R1, where R2 is the value of the resistance 26, the voltage $V_1$ is given by $$V_1 = \frac{-I_c R_x R2}{R1 + R_x} \qquad (2)$$

The total charge Q stored by the capacitor C1 during the first time interval is therefore given by $$Q = \frac{-I_c R_x R2 T_o}{R3(R1 + R_x)} \qquad (3)$$

It can be seen from equation (3) that Q is not linearly related to $R_x$.

The advancement of the count in the ring counter 64 to three is effective to close both of the switches S2 and S3. The closure of the switches S2 and S3 initiates a second time interval, during which a current $V_R/R4$ is applied to the input 31 of the amplifier 32 via the switch S3, where R4 is the value of the resistance 34 and is typically equal to R3, and a current $V_1/R5$ is applied to the input 31 of the amplifier 32 via the switch S2, where R5 is the value of the resistance 30. The total current $I_2$ applied to the input 31 is therefore given by $$I_2 = \frac{V_R}{R3} - \frac{I_c R_x R2}{R5(R1 + R_x)} \qquad (4)$$

The voltage $V_R$ is chosen to ensure that this current is opposite in polarity to the current $I_1$. The current $I_2$ is again linearly integrated by the amplifier 32 and capacitor C1, this time producing a negative-going voltage ramp at the output 35 of the amplifier 32, as shown at 76 in FIG. 2. This ramp continues until the voltage at the output 35 of the amplifier 32 again reaches zero, whereupon the differential amplifier 38 produces an output signal at its output 41. This output signal marks the end of the second time interval, and is operative via the delay 64, the inverter 65 and the AND gate 63 to produce a short positive-going pulse at the output of the AND gate 63. This pulse briefly opens the transfer gates 50, thereby strobing or transferring the count in the counter 46 at that instant into the staticiser 52. Since the counter 46 commenced counting upwardly from zero at the beginning of the second time interval, the count strobed into the staticiser 52 is directly representative of the time T required to return the voltage at the output 35 of the amplifier 32 go zero, i.e., the duration of the second time interval. The charge Q removed from the capacitance C1 during the second time interval is given by $$Q = \frac{V_R}{R3} - \frac{I_c R_x R2}{R5(R1 + R_x)} \, T \qquad (5)$$

Hence, combining equations (3) and (5) and re-arranging gives $$\frac{I_c R_x R2}{R3(R1+R_x)} = \frac{V_R}{R3} - \frac{I_c R_x R2}{R5(R1+R_x)} \, \frac{T}{T_o} \qquad (6)$$

or $$[I_c R2 R5] R_x = [V_R R5(R1+R_x) - I_c R2 R3 R_x] T/T_o \qquad (7)$$

By selecting the value R5 to be given by $$R5 = \frac{I_c R2 R3}{V_R} \qquad (8)$$

equation (7) simplifies to $$[I_c R2] R_x = [V_R R1] \frac{T}{T_o} \qquad (9)$$

or $$R_x = kT, \qquad (10)$$

where $k$ is equal to $$\frac{V_R R1}{I_c R2 T_o}$$

and is a constant. Thus the count strobed into the staticiser 52 is linearly representative of $R_x$. By appropriate choice of the values of $V_R$, $I_c$, R1 and R2 and by appropriate scaling, this count is made directly representative of the value $R_x$ in ohms, kilohms or megohms as desired. The count in the staticiser 52 is decoded in the decoder 54 and displayed by the display unit 56.

The pulse produced by the AND gate 63 is also operative, via the OR gate 60, to change the count of the ring counter 62 to four, thereby closing the switches S4 to S7 via the OR gate 71 and restoring the ohmmeter 10 to its drift correct mode of operation. This mode of operation is maintained while the counter 46 again produces an overflow signal at its output 58, thereby returning the count in the ring counter 62 to one, whereupon the whole sequence of events described hereinbefore is repeated. The display unit 56 continues to display the decoded count in the staticiser 52 until a new count value is strobed thereinto.

Thus, to summarise, in the digital ohmmeter 10, the nonlinear relationship between the value $R_x$ of the unknown resistance 15 and the voltage $V_x$ generated thereacross by the constant current $I_c$, which non-linear relationship is due to the finite input impedance of the buffer amplifier 28, results in a non-linear relationship between $R_x$ and the total charge Q stored on the capacitance C1 during the first time interval. To compensate for this, during the second time interval a predetermined multiple of the voltage $V_x$, which multiple is determined by the value R5 selected for the resistance 30, is algebraically summed at the input 31 of the amplifier 32 with the voltage $V_R$, so that the charge Q is withdrawn from the capacitance C1 at a rate which is also non-linearly related to $R_x$. The predetermined multiple is selected to ensure that the total time taken to remove the charge Q, i.e. the duration of the second time interval, is linearly related to $R_x$. The factor by which $V_x$ is multiplied to produce the predetermined multiple thereof can be greater or less than unity.

It will be appreciated that the application during the second time interval of the predetermined multiple of the voltage $V_x$ to the integrator constituted by the amplifier 32 and the capacitance C1 can be effected in ways other than that shown in FIG. 1. For example the resistance 30 and the switch S2 can be omitted, and replaced by the series combination a resistance 78 having a value R6 and a switch S5 connected in parallel with the feedback resistance 26 of the buffer amplifier 28, as shown in dotted lines in FIG. 1, the switch S5 being operable in unison with the switch S3 and the switch S1 being closed during the second time interval as well as during the first time interval. In this case, the total charge removed from the capacitance C1 during the second time interval becomes $$Q = \left[\frac{V_R}{R3} - \frac{I_r R_x R_f}{R3(R1+R_x)}\right] T \qquad (11)$$

where $R_f$ is the value of the parallel combination of the resistances 26 and 78 and is given by $$R_f = \frac{R2R6}{R2+R6} \qquad (12)$$

Combining equations (3) and (11) and re-arranging gives $$\frac{I_r R2 R_x}{R3(R1+R_x)} = \left[\frac{V_R}{R3} - \frac{I_r R_x R2R6}{R3(R2+R6)(R1+R_x)}\right] \frac{T}{T_o} \qquad (13)$$

or $[I_r R2(R2+R6)] R_x = [V_R(R2+R6)(R1+R_x) - I_r R_x R2R6] \dfrac{T}{T_o}$ (14)

This can be made a linear equation between $R_x$ and T if R6 is selected so that $$V_R(R2+R6) = I_r R2R6 \qquad (15)$$

whence $$R6 = \frac{V_R R2}{I_r R2 - V_R} \qquad (16)$$

FIG. 3 shows an alternative embodiment of the input circuitry of the ohmmeter 10 of FIg. 1, in which the terminal 12 is connected via a resistance 80 to the reference voltage source 33, instead of to the current source 16: the remainder of the ohmmeter is as shown in FIG. 1. In this case, the voltage $V_1'$ at the output 24 of the buffer amplifier 28 is given by $$V_1' = V_R \frac{R \times R2}{R_x R1 + R_x R7 + R1R7} \qquad (17)$$

where R7 is the value of the resistance 80. The total charge $Q'$ stored on and removed from the capacitance C1 during the first and second time intervals respectively is $$Q' = \frac{V_R R_x R2\, T_o}{R3[R_x R1+R_x R7+R1R7]} = \left[\frac{V_R}{R3} - \frac{V_R R_x R2}{R5[R_x R1+R_x R7+R1R7]}\right] T \qquad (18)$$

Re-arranging gives $$[R2R5]\, R_x = [R5[R_x R1+R_x R7+R1R7] - R_x R2R3]\, \frac{T}{T_o} \qquad (19)$$

Again, equation (19) defines a linear relationship between $R_x$ and T if $$R2R3 = R5(R1+R7) \qquad (20)$$

i.e. if R5 is selected to be given by $$R5 = \frac{R2R3}{R1+R7} \qquad (21)$$

FIG. 4 shows yet another embodiment of the input circuitry of the ohmmeter 10 of FIG. 1, arranged to measure the value $G_x$ of an unknown conductance 82 connected between the terminals 12, 14. This time, the terminal 12 is connected directly to the reference voltage source 33 instead of to the current source 16 and to the resistance 19, while the terminal 14 is connected to the resistance 19 instead of being grounded. Thus the unknown conductance 82 is connected in series between the source 33 and the resistance 19, this latter resistance serving to protect the amplifier 22 in the event that the value $G_x$ of the conductance 82 is very high. Again, the remainder of the ohmmeter is as shown in FIG. 1.

In the FIG. 4 embodiment, the voltage $V_1''$ at the output 24 of the buffer amplifier 28 is given by $$V_1'' = V_R \frac{R2G_x}{1+R1G_x} \qquad (22)$$

so that the total charge $Q''$ stored on and removed from the capacitance C1 during the first and second time intervals respectively is $$Q'' = \frac{V_R R2 G_x}{R3(1+R1G_x)}\, T_o = \left[\frac{V_R}{R3} - \frac{V_R R2 G_x}{R5(1+R1G_x)}\right] T \qquad (23)$$

Hence $[R2R5]\, G_x = [R5(1+R1G_x) - R2R3G_x] \dfrac{T}{T_o}$ (24)

This represents a linear relationship between $G_x$ and T if $$R5R1 = R2R3 \quad (25)$$

i.e. if R5 is selected to be given by $$R5 = \frac{R2R3}{R1} \quad (26)$$

It will be appreciated that in the embodiments of FIGS. 3 and 4, the resistance 30 and the switch S2 can be replaced as described with respect to FIG. 1 by the series combination of a switch such as the switch S5 and a resistance such as the resistance 78: obviously, the required value of the resistance has to be calculated for each embodiment. Also, in all of the embodiments described, the buffer amplifier 28 may be omitted altogether under some circumstances.

Although the invention has been described in relation to an analogue-to-digital converter of the type in which a signal of unknown magnitude (i.e. $V_x$) is integrated during a first fixed time interval to change the charge stored on a capacitance from a datum level and then an opposing reference signal (i.e. $V_R$) is integrated during a second time interval to change the charge stored on the capacitance back to the datum level, it can be applied to other types of analogue-to-digital converter. In particular, it can be applied to converters of the type described in U.K. Pat. specifications Nos. 1,220,091 and 869,262. In the type of converter described in the former of these specifications, the weight of the reference signal and the weight with which the clock pulses are counted are both scaled down by a common factor during the second time interval when the integrator output level reaches a level close to the datum level: to apply the present invention to this type of converter, the algebraic sum of the reference signal, i.e. the voltage $V_R$, and the predetermined multiple of $V_x$, are both scaled down by the common factor. In the type of converter described in the latter of the specifications, the signal of unknown magnitude (i.e. $V_x$) is integrated continuously to drive the integrator output level away from a datum value, and an opposing reference signal is periodically applied to the integrator to restore the output level to the datum value. Once equilibrium is reached, a measurement is effected over a measurement interval comprising one or more integral cycles of the application of the reference signal, the ratio of the total duration of the application or applications of the reference signal to the total duration of the measurement interval being measured. Thus in this case, the first time interval is constituted by the measurement interval, and includes the second time interval, which is constituted by the total duration of the application or applications of the reference signal. To apply the present invention to this type of converter, the predetermined multiple of $V_x$ is applied to the integrator during the second time interval in addition to the normal application of $V_x$ which is taking place continuously. Finally, the invention is also applicable to integrating analogue-to-digital converters of the voltage-to-frequency conversion type, in which the second time interval is again included within the first time interval and made up of a plurality of short separate intervals.

What is claimed is:

1. Apparatus for producing an electrical output signal whose magnitude is linearly representative of the value of an unknown electrical resistance, the apparatus comprising:
   means for passing a current through the unknown resistance to generate an analogue voltage thereacross whose magnitude is dependent on the value of the unknown resistance;
   integrating means;
   first circuit means for applying the analogue voltage to the integrating means during a first time interval, so as to drive the level of the signal at the output of the integrating means away from a datum value;
   a source of a reference signal;
   second circuit means for applying the reference signal to the integrating means during a second time interval which succeeds the first time interval so as to drive the level of the signal at the output of the integrating means back towards the datum value; and
   means responsive to the level of the signal at the output of the integrating means for producing an output signal whose magnitude is representative of the ratio between the respective durations of said first and second time intervals;
   third circuit means for applying a predetermined multiple of the analogue voltage to the integrating means during the second time interval;
   the magnitude of sid predetermined multiple of the analogue voltage being selected to ensure that said ratio is linearly related to the value of the unknown resistance, whereby the magnitude of said output signal is linearly representative of the value of the unknown resistance.

2. Apparatus as claimed in claim 1, wherein the current passing means comprises a constant current source arranged, in operation, to pass a substantially constant current through the unknown resistance.

3. Apparatus as claimed in claim 1, wherein the current passing means comprises a reference voltage source, and a known resistance, the arrangement being such that, in operation, the reference voltage source is connected to the series combination of the known and unknown resistances.

4. Apparatus as claimed in claim 3, wherein the reference voltage source constitutes said reference signal source.

5. Apparatus as claimed in claim 1, wherein the first time interval is of substantially fixed duration, whereby the duration of the second time interval is linearly related to the value of the unknown resistance.

6. Apparatus as claimed in claim 5, wherein the output signal producing means comprises means for producing an output pulse whose duration is linearly related to the duration of the second time interval.

7. Apparatus as claimed in claim 5, wherein the output signal producing means comprises a source of clock pulses and counter means arranged to count the clock pulses throughout the second time interval, the output signal being derived from the count in the counter means at the end of the second time interval.

8. Apparatus as claimed in claim 1, wherein the integratng means comprises an inverting amplifier having an input and an output, and a capacitance which is feedback connected between the output and the input of the inverting amplifier.

9. Apparatus as claimed in claim 8, wherein the first circuit means comprises an input resistance connected in series with the input of the inverting amplifier, and a buffer amplifier having a respective input resistance and a feedback resistance, the output of the buffer amplifier being connected to the first-mentioned input resistance.

10. Apparatus as claimed in claim 9, wherein the second circuit means comprises a further input resistance connected between the reference signal source and the input of the inverting amplifier and the third circuit means comprises a yet further input resistance connected to receive said analogue voltage via the buffer amplifier.

11. Apparatus for producing an electrical output signal whose magnitude is linearly representative of an unknown electrical conductance, the apparatus comprising:
  means for applying a voltage to the unknown conductance to pass therethrough an analogue current whose magnitude is dependent on the value of the unknown conductance;
  integrating means;
  first circuit means for applying the analogue current to the integrating means during a first time interval so as to drive the level of the signal at the output of the integrating means away from a datum value;
  a source of a reference signal;
  second circuit means for applying the reference signal to the integrating means during a second time interval which succeeds the first time interval, so as to drive the level of the signal at the output of the intergrating means back towards the datum value; and
  means responsive to the level of the signal at the output of the integrating means for producing an output signal whose magnitude is representative of the ratio between the respective durations of said first and second time intervals;
  third circuit means for applying a predetermined multiple of the analogue current to the integrating means during the second time interval;
  the magnitude of said predetermined multiple of the analogue current being selected to ensure that said ratio is linearly related to the value of the unknown conductance, whereby the magnitude of said output signal is linearly representative of the value of the unknown conductance.

12. Apparatus as claimed in claim 11, wherein the first time interval is of substantially fixed duration, whereby the duration of the second time interval is linearly related to the value of the unknown conductance.

13. Apparatus as claimed in claim 12, wherein the output signal producing means comprises means for producing an output pulse whose duration is linearly related to the duration of the second time interval.

14. Apparatus as claimed in claim 12, wherein the output signal producing means comprises a source of clock pulses and counter means arranged to count the clock pulses throughout the second time interval, the output signal being derived from the count in the counter means at the end of the second time interval.

15. Apparatus as claimed in claim 11, wherein the integrating means comprises an inverting amplifier having an input and an output, and a capacitance which is feedback connected between the output and the input of the inverting amplifier.

16. Apparatus as claimed in claim 15, wherein the first circuit means comprises an input resistance connected in series with the input of the inverting amplifier, and a buffer amplifier having a respective input resistance and a feedback resistance, the output of the buffer amplifier being connected to the first-mentioned input resistance.

17. Apparatus as claimed in claim 16, wherein the second circuit means comprises a further input resistance connected between the reference signal source and the input of the inverting amplifier and the third circuit means comprises a yet further input resistance connected to receive said analogue current via the buffer amplifier.

18. Apparatus for producing an electrical output signal whose magnitude is linearly representative of the value of an unknown electrical resistance, the apparatus comprising:
  means for passing a current through the unknown resistance to generate an analogue voltage thereacross whose magnitude is dependent on the value of the unknown resistance;
  integrating means;
  first circuit means for applying the analogue voltage to the integrating means during a first time interval, so as to drive the level of the signal at the output of the integrating means away from a datum value;
  a source of a reference signal;
  second circuit means for applying the reference signal to the integrating means during a second time interval which is included within the first time interval so as to drive the level of the signal at the output of the integrating means back towards the datum value; and
  means responsive to the level of the signal at the output of the integrating means for producing an output signal whose magnitude is representative of the ratio between the respective durations of said first and second time intervals;
  third circuit means for applying a predetermined multiple of the analogue voltage to the intergrating means during the second time interval, in addition to the application of the analogue voltage already taking place via the first circuit means;
  the magnitude of said predetermined multiple of the analogue voltage being selected to ensure that said ratio is linearly related to the value of the unknown resistance, whereby the magnitude of said output signal is linearly representative of the value of the unknown resistance.

19. Apparatus as claimed in claim 18, wherein the current passing means comprises a constant current source arranged, in operation, to pass a substantially constant current through the unknown resistance.

20. Apparatus as claimed in claim 18, wherein the current passing means comprises a reference voltage course, and a known resistance, the arrangement being such that, in operation, the reference voltage source is connected to the series combination of the known and unknown resistances.

21. Apparatus as claimed in claim 20, wherein the reference voltage source constitutes said reference signal source.

22. Apparatus as claimed in claim 18, wherein the first time interval is of substantially fixed duration, whereby the duration of the second time interval is linearly related to the value of the unknown resistance.

23. Apparatus as claimed in claim 22, wherein the output signal producing means comprises means for producing an output pulse whose duration is linearly related to the duration of the second time interval.

24. Apparatus as claimed in claim 22, wherein the output signal producing means comprises a source of clock pulses and counter means arranged to count the clock pulses throughout the second time interval, the output signal being derived from the count in the counter means at the end of the second time interval.

25. Apparatus as claimed in claim 18, wherein the integrating means comprises an inverting amplifier having an input and an output, and a capacitance which is feedback connected between the output and the input of the inverting amplifier.

26. Apparatus as claimed in claim 25, wherein the first circuit means comprises an input resistance connected in series with the input of the inverting amplifier, and a buffer amplifier having a respective input resistance and a feedback resistance, the output of the buffer amplifier being connected to the first-mentioned input resistance.

27. Apparatus as claimed in claim 26, wherein the second circuit means comprises a further input resistance connected between the reference signal source and the input of the inverting amplifier, and the third circuit means comprises a yet further input resistance connected to receive said analogue voltage via the buffer amplifier.

28. Apparatus for producing an electrical output signal whose magnitude is linearly representative of an unknown electrical conductance, the apparatus comprising:
means for applying a voltage to the unknown conductance to pass therethrough an analogue current whose magnitude is dependent on the value of the unknown conductance;
integrating means;
first circuit means for applying the analogue current to the integrating means during a first time interval so as to drive the level of the signal at the output of the integrating means away from a datum value;
a source of a reference signal;
second circuit means for applying the reference signal to the integrating means during a second time interval which is included within the first time interval, so as to drive the level of the signal at the output of the integrating means back towards the datum value; and
means responsive to the level of the signal at the output of the integrating means for producing an output signal whose magnitude is representative of the ratio between the respective durations of said first and second time intervals;
third circuit means for applying a predetermined multiple of the analogue current to the integrating means during the second time interval, in addition to the application of the analogue current already taking place via the first circuit means;
the magnitude of said predetermined multiple of the analogue current being selected to ensure that said ratio in linearly related to the value of the unknown conductance, whereby the magnitude of said output signal is linearly representative of the value of the unknown conductance.

29. Apparatus as claimed in claim 28, wherein the first time interval is of substantially fixed duration, whereby the duration of the second time interval is linearly related to the value of the unknown conductance.

30. Apparatus as claimed in claim 29, wherein the output signal producing means comprises means for producing an output pulse whose duration is linearly related to the duration of the second time interval.

31. Apparatus as claimed in claim 29, wherein the output signal producing means comprises a source of clock pulses and counter means arranged to count the clock pulses throughout the second time interval, the output signal being derived from the count in the counter means at the end of the second time interval.

32. Apparatus as claimed in claim 28, wherein the integrating means comprises an inverting amplifier having an input and an output, and a capacitance which is feedback connected between the output and the input of the inverting amplifier.

33. Apparatus as claimed in claim 32, wherein the first circuit means comprises an input resistance connected in series with the input of the inverting amplifier, and a buffer amplifier having a respective input resistance and a feedback resistance, the output of the buffer amplifier being connected to the first-mentioned input resistance.

34. Apparatus as claimed in claim 33, wherein the second circuit means comprises a further input resistance connected between the reference signal source and the input of the inverting amplifier, and the third circuit means comprises a yet further input resistance connected to receive said analogue current via the buffer amplifier.

35. In an apparatus for producing an electrical output signal whose magnitude is linearly representative of the value of an unknown electrical resistance, the apparatus including: means for passing a current through the unknown resistance to generate an analogue voltage thereacross whose magnitude is dependent on the value of the unknown resistance; integrating means; first circuit means for applying the analogue voltage to the integrating means during a first time interval, so as to drive the level of the signal at the output of the integrating means away from a datum value; a source of a reference signal; second circuit means for applying the reference signal to the integrating means during a second time interval, so as to drive the level of the signal at the output of the integrating means back towards the datum value; and means responsive to the level of the signal at the output of the integrating means for producing an output signal whose magnitude is representative of the ratio between the respective durations of the first and second time intervals; an improvement for compensating for non-linearity resulting from loading of said analogue voltage by the first circuit means, comprising:
third circuit means for applying a predetermined multiple of the analogue voltage to the integrating means during the second time interval;
the magnitude of said predetermined multiple of the analogue voltage being selected such that said ratio is linearly related to the value of the unknown resistance, whereby the magnitude of said output signal is linearly representative of the value of the unknown resistance.

36. In an apparatus for producing an electrical output signal whose magnitude is linearly representative of an unknown electrical conductance, the apparatus including: means for applying a voltage to the unknown conductance to pass therethrough an analogue current whose magnitude is dependent on the value of the unknown conductance; integrating means; first circuit means for applying the analogue current to the integrating means during a first time interval so as to drive the level of the signal at the output of the integrating means away from a datum value; a source of a reference signal; second circuit means for applying the reference signal to the integrating means during a second time interval so as to drive the level of the signal at the output of the integrating means back towards the datum value; and means responsive to the level of the signal at the output of the integrating means for producing an output signal whose magnitude is representative of the ratio between the respective durations of said first and second time intervals; an improvement for compensating for non-linearity resulting from modification of said analogue current by the first circuit means, comprising:

third circuit means for applying a predetermined multiple of the analogue current to the integrating means during the second time interval;

the magnitude of said predetermined multiple of the analogue current being selected such that said ratio is linearly related to the value of the unknown conductance, whereby the magnitude of said output signal is linearly representative of the value of the unknown conductance.

* * * * *